United States Patent [19]
Wynn

[11] Patent Number: 6,118,810
[45] Date of Patent: Sep. 12, 2000

[54] MULTI-CHANNEL BASE STATION/ TERMINAL DESIGN COVERING COMPLETE SYSTEM FREQUENCY RANGE

[75] Inventor: Stephen R. Wynn, Lynchburg, Va.

[73] Assignee: Ericsson, Inc., Research Triangle Park, N.C.

[21] Appl. No.: 08/848,435

[22] Filed: May 8, 1997

[51] Int. Cl.[7] .................................................. H04B 1/38
[52] U.S. Cl. ........................ 375/219; 375/267; 375/299; 375/347
[58] Field of Search ..................... 375/200, 219, 375/221, 259, 267, 295, 297, 299, 316, 322, 324, 326, 130; 332/100; 342/357; 455/47, 126

[56] References Cited

U.S. PATENT DOCUMENTS

| | | | |
|---|---|---|---|
| 5,109,531 | 4/1992 | Heck ........................................ | 455/47 |
| 5,483,550 | 1/1996 | Hulbert .................................... | 375/134 |
| 5,535,247 | 7/1996 | Gailus et al. ........................... | 375/297 |
| 5,537,435 | 7/1996 | Carney et al. .......................... | 375/219 |
| 5,564,087 | 10/1996 | Cygan et al. ........................... | 455/126 |
| 5,579,341 | 11/1996 | Smith et al. ............................ | 375/267 |
| 5,606,575 | 2/1997 | Williams ................................. | 375/219 |
| 5,701,106 | 12/1997 | Pikkarainen et al. ................... | 332/100 |
| 5,724,046 | 3/1998 | Martin et al. ........................... | 342/357 |
| 5,828,705 | 10/1998 | Kroeger et al. ......................... | 375/326 |
| 5,838,732 | 11/1998 | Carney ................................... | 375/297 |
| 5,862,181 | 1/1999 | Ishizuka ................................. | 375/259 |

FOREIGN PATENT DOCUMENTS

WO 98 13944  4/1998  WIPO.

OTHER PUBLICATIONS

PCT Preliminary Examination Report, PCT/US98/06891, dated Jul. 13, 1999.

*Primary Examiner*—Stephen Chin
*Assistant Examiner*—Chieh M. Fan
*Attorney, Agent, or Firm*—Nixon & Vanderhye P.C.

[57] ABSTRACT

A transmitter/receiver basestation processing a plurality of channels in an RF band is disclosed. The transmitters and receivers of the present invention up-convert or down-convert the RF band as a whole, rather than on a channel-by-channel basis. After up-converting/down-converting to intermediate frequency, the respective channel signals are extracted/combined by means of a plurality of mixed-up or mixed-down base band carriers. The present basestation dramatically improves the efficiencies of the basestation such that the components of the basestation can be integrated on a single chip.

46 Claims, 7 Drawing Sheets

MULTI-CHANNEL BASE STATION/ TERMINAL DESIGN COVERING COMPLETE SYSTEM FREQUENCY RANGE

FIELD OF THE INVENTION

This invention relates to telecommunications, and more particularly to telecommunications basestation and terminal designs.

BACKGROUND OF THE INVENTION

RF devices are today used for communications in a wide number of applications from personal cellular telephones to emergency medical radios, and many more applications are envisioned for the future. In today's environment, various types of RF radios communicate with each other through a remote base station site 100 (FIG. 1) that receives and transmits communications signals to and from the various radios. For this reason, remote base station sites are strategically located around a geographic area to ensure that good communications conditions will exist between a base station site and a radio within the area.

The base stations are designed to process a multitude of conversations simultaneously, and to do so over a multitude of different communications channels. In one type of mobile radio, for example, twenty six channels are provided for communications at transmission frequencies between 896–902 MHz. Of course, the number of channels or the transmission frequencies vary depending upon the RF system currently being implemented.

As shown in FIG. 2, the base station 100 includes an antenna 200 connected to a transmission combiner 202 at the transmission end of the base station 100 and a receiver coupler 204 at the receiving end of the base station 100. The antenna 200, transmission combiner 202, and receiver coupler 204 thus combine to service a plurality of duplex RF channel transmit/receive circuits. For example, as shown in FIG. 2, the $R_x$ coupler 204 receives a signal band from antenna 200 and converts the signal band into a plurality of channels, CH1, CH2, CH3 . . . CHn, which is then directed to corresponding repeater stations 205–208.

Each repeater station 205–208 services one of the channels CH1–CHn. That is, station 205 services CH1, station 206 services CH2, etc. Each station includes transmitting circuitry "T" and receiving circuitry "R". As previously described, each receiver "R" of the stations 205–208 receives one channel signal from the $R_x$ coupler 204. Likewise, each transmitter "T" of the stations 205–208 services one channel to the $T_x$ combiner 202.

Each station transmitter and receiver is typically controlled by a dedicated control shelf CS (e.g., a microprocessor-based control circuit), as shown in FIG. 2. The control shelves CS communicate with, and are controlled by, trunking cards TC 209–212. The trunking cards TC (e.g., further microprocessor-based control circuits) communicate with one another and/or with a primary site controller 214. The primary site controller 214 provides the major intelligence and control capability for the system 100. As can be seen in FIG. 2, as the number of channels increases and the number of systems 100 increases, the number of dedicated control shelves CS required for a full communication basestation can become quite large. This occurs since the stations 205–208 are provided as dedicated stations for each of the channels received by $R_x$ coupler 204 or transmitted by $T_x$ combiner 202.

Multi-channel basestations are thus old. Also, the general concept of zero-if or receivers with multi-channels is old. The basic concepts of prior configurations have, however, introduced several problems that up to now seemed insurmountable.

One prior configuration proposed that several channels (perhaps 8 or so) be block received and then an FFT be run on the full block. By a technique of frequency shifting in the frequency domain this configuration proposed to extract the specific channel desired.

Another proposal involved placing the multi-channel block into an A/D converter with a large dynamic range and then sorting the data by a DSP.

The problems that occur with these methods are listed below:

- DSP's to sample and sort through a +/−10 MHz band of signals are not available with the speed or MIPS to do anything of value. The sample rate for the interrupts would consume virtually all the MIPS available, much less allow any real processing to occur.
- The inherent dynamic range of signals to extract is potentially greater than 100 dB with many signals at near thermal noise levels. Known A/Ds are not capable of accurately digitizing this range, much less have the quantization resolution to not add its own noise to lower level signals. Therefore some gain would have to be placed before the A/D. Once gain is added, the overall dynamic range is reduced since very strong signals could then overwhelm the circuits before a very small signal could be extracted.

SUMMARY OF THE INVENTION

The present invention provides a basestation design that is capable of processing multiple channels with significantly smaller amounts of rack space in the circuits and cabinets housing the basestation. The present invention is a design which permits the basestation system to be fully integrated into ICs, thus decreasing the size of the transmitter/receiver components needed.

The present invention in its preferred embodiment is fundamentally different from the prior art in that it receives and down-converts the entire RF band of interest before delivering it to other $R_x$ blocks to extract the desired channels. Similarly, on the transmission side, the transmitter up-converts the entire RF band of interest before delivering it to the antenna. On the receiver side, once the entire RF band of interest is down-converted, the individual channel signals are extracted using multiple low-frequency IC-based receiver blocks controlled by a multiple output direct digital synthesis block that extracts each signal as needed. In this way, one station receiver can receive the entire 26 or more channels in an RF band of interest in the same unit. A similar situation occurs on the transmission side.

The concept of mix to baseband and multi-channel receivers is not new by any means. However, this approach is the first practical configuration that solves the problems described in the Background. It solves them with a means that is both technologically feasible, compact, and cost effective.

BRIEF DESCRIPTION OF THE DRAWINGS

These, as well as other objects and advantages of this invention, will be more completely understood and appreciated by careful study of the following more detailed description of a presently preferred exemplary embodiment of the invention taken in conjunction with the accompanying drawings, of which.

DETAILED DESCRIPTION OF THE PRESENTLY PREFERRED EMBODIMENT

Figure 1:
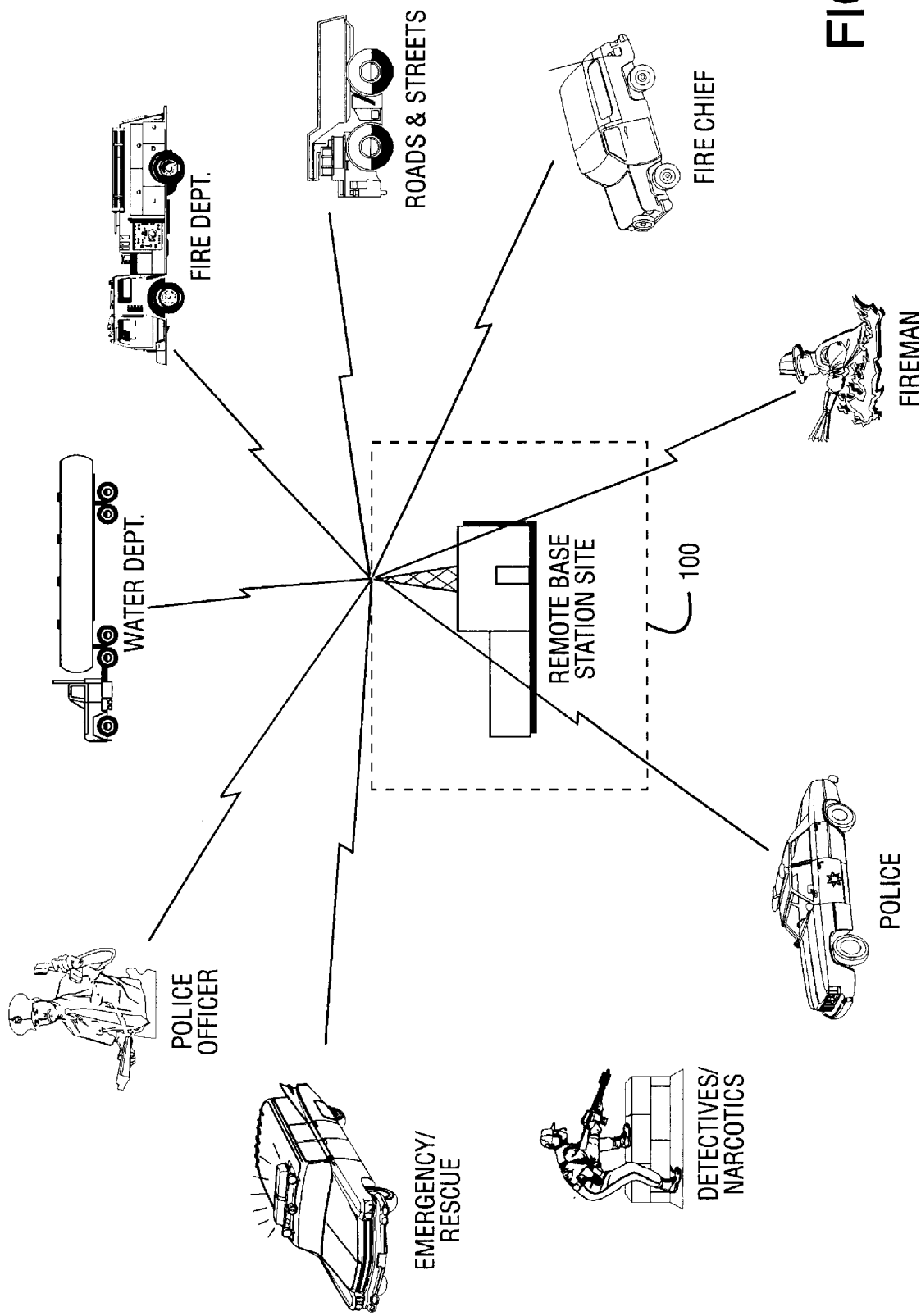
FIG. 1 is a general explanatory diagram of a trunked repeater system.
Figure 2:
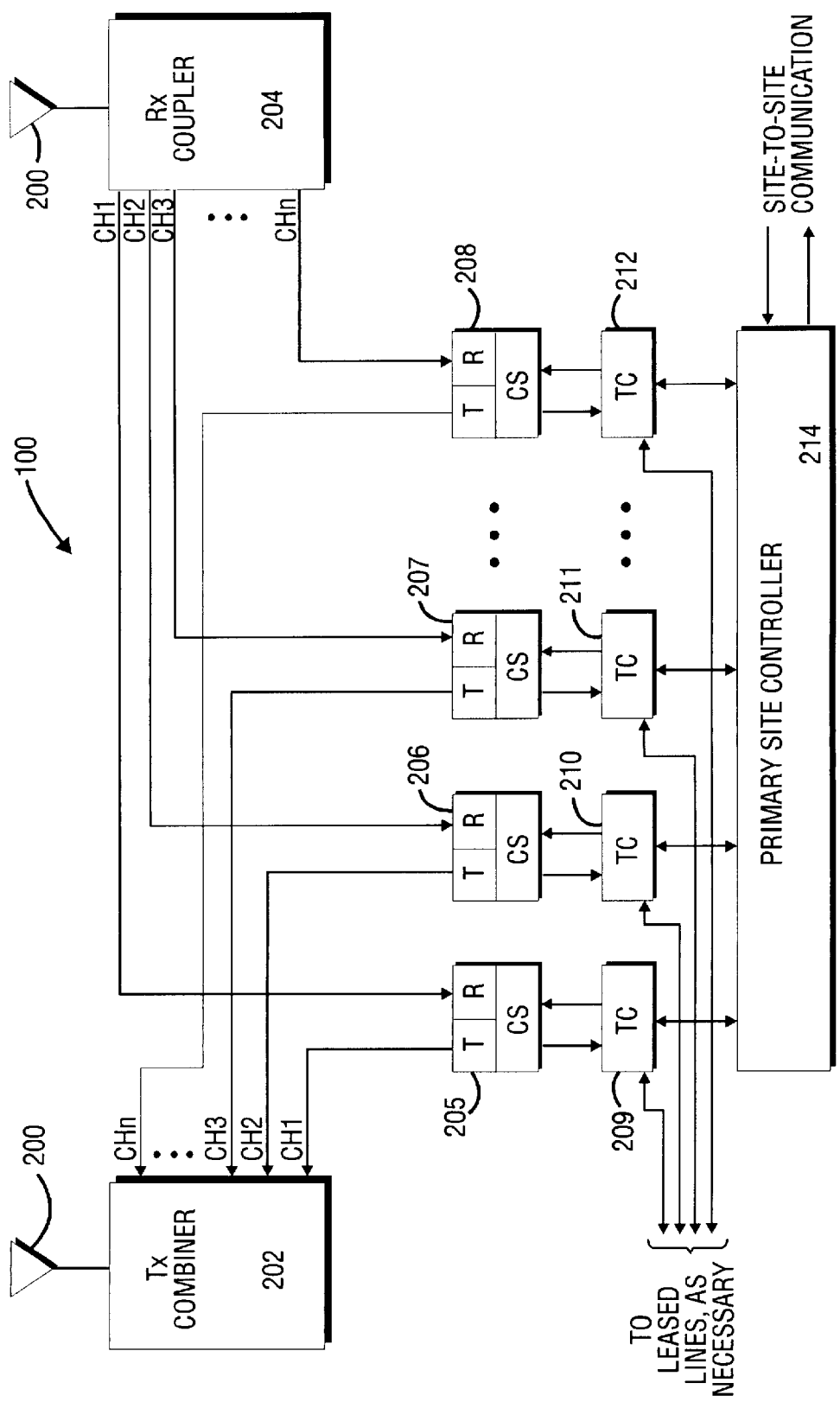
FIG. 2 is a schematic diagram of a repeater system according to the prior art.
Figure 3:
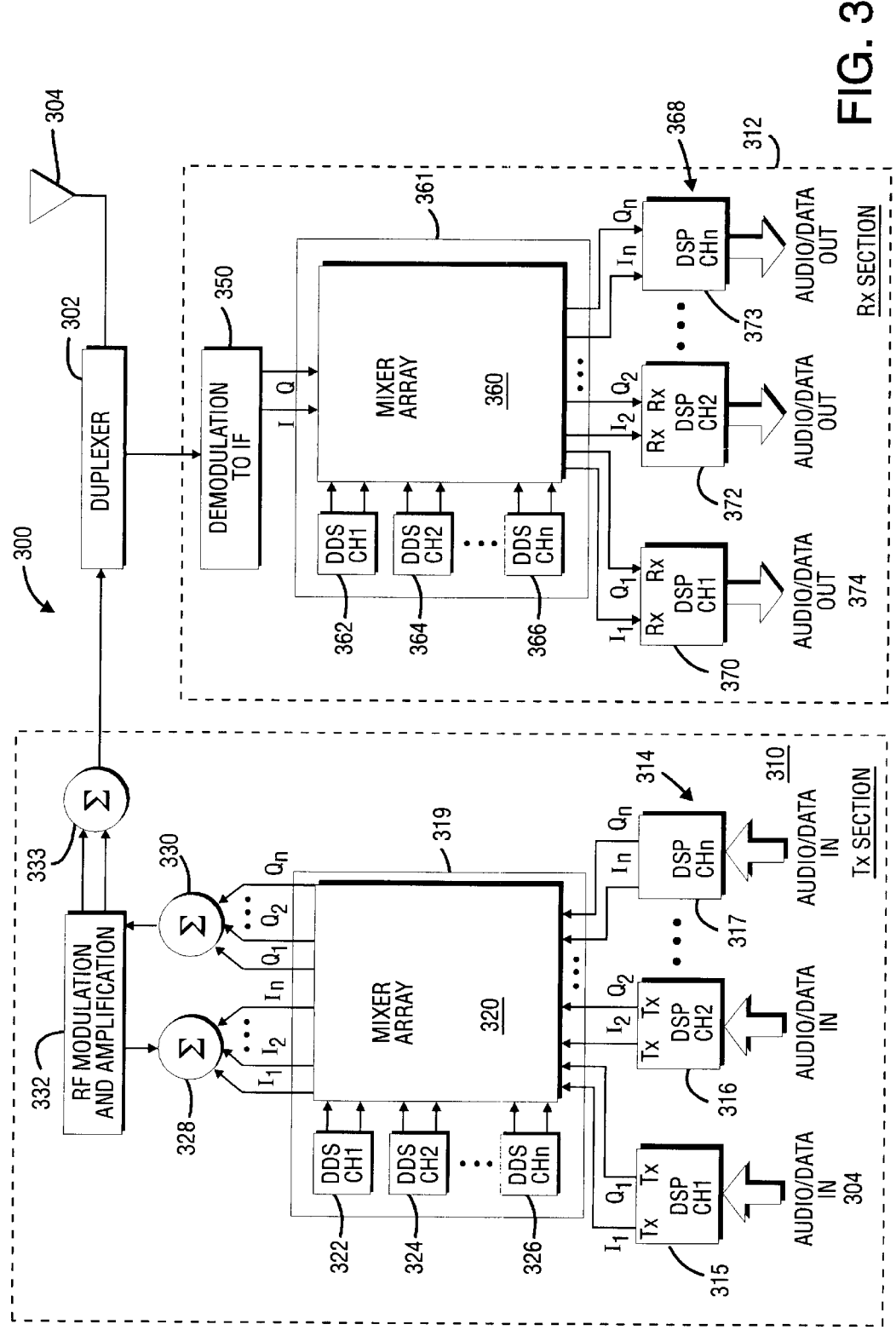
FIG. 3 is a schematic diagram of one example embodiment of the present invention.

FIG. 3 illustrates a general basestation system 300 according to one example embodiment of the present invention. In FIG. 3, an RF band is received or transmitted on antenna 304 through duplexer 302. Duplexer 302 is connected to $T_x$ section 310 and $R_x$ section 312, such that in the transmit mode, $T_x$ section 310 is connected to antenna 304 and in the receive mode, $R_x$ section 312 is connected to antenna 304.

The $R_x$ section 312 includes a demodulator 350 connected to an $R_x$ channel extractor 361. From the $R_x$ channel extractor 361, channel signals are provided to a plurality of DSPs 368, from which audio outputs 374 are generated. The specific structures and operations of these components are described more fully below.

The $R_x$ channel extractor 361 includes a mixer array 360 to which the quadrature I and Q signals of the demodulator 350 are applied. Also included in the $R_x$ channel extractor 361 are a plurality of Direct Digital Synthesis blocks (DDS) 362, 364, 366, one for each channel in the band provided from the antenna 304. A detailed explanation of how the $R_x$ channel extractor 361, using the mixer array 360 and DDSs 362–366, extracts the RF channels from the RF band is described more fully below with respect to FIGS. 4–6.

The output of the mixer array 360 is a plurality of quadrature signals, one pair per channel received. That is, the quadrature pair $I_1$ and $Q_1$ that are output from mixer array 360 correspond to quadrature signals of channel 1, and are provided to the $R_x$ input of the DSP 370 dedicated to channel 1. Similarly, $I_2$ and $Q_2$ are the quadrature signals for channel 2, and are provided to the $R_x$ inputs of DSP 372 dedicated to channel 2. Likewise, a number of additional DSP's 368 are provided, one for each channel, such that $I_n$ and $Q_n$ quadrature pairs of signals will be provided, one for each channel, with the $I_n$ and $Q_n$ signal going to the n-th DSP 373.

On the transmission side, $T_x$ section 310 begins with an audio input 304 to respective DSP's 314, one for each channel. That is, DSP 315 is dedicated to channel 1 and provides quadrature outputs $I_1$ and $Q_1$ at its respective $T_x$ outputs. Similarly, DSP 316 provides $I_2$ and $Q_2$ signals for channel 2, and so on up to DSP 317 that provides $I_n$ and $Q_n$ signals for the n-th channel. The quadrature signals from the DSPs 314 are provided to a mixer array 320 and the $T_x$ channel combiner 319. Also provided to the mixer array 320 are a plurality of waveforms from the DDS's 322–326. One DDS is provided for each of the "n" number of channels. A more detailed description of the operation of a mixer array and the $T_x$ channel combiner 319 is provided below with respect to FIGS. 4–6.

The output of mixer array 320 includes a number of channel signals $I_1$–$I_n$ and $Q_1$–$Q_n$, which have been located in their proper channel in the RF band. The real portions ($I_1$–$I_n$) are summed at summing gate 328 and the imaginary portions ($Q_1$–$Q_n$) are summed at the summing gate 330. The sums are then provided to an RF modulation and amplification block 332 where they are up-converted to RF and amplified by power amplifiers. The real and imaginary portions are then provided from the RF modulation and amplification block 332 to a summing gate 333 where they are added together. This sum from the summing gate 333 is provided to the duplexer 302 and ultimately to the antenna 304.

Figure 4:
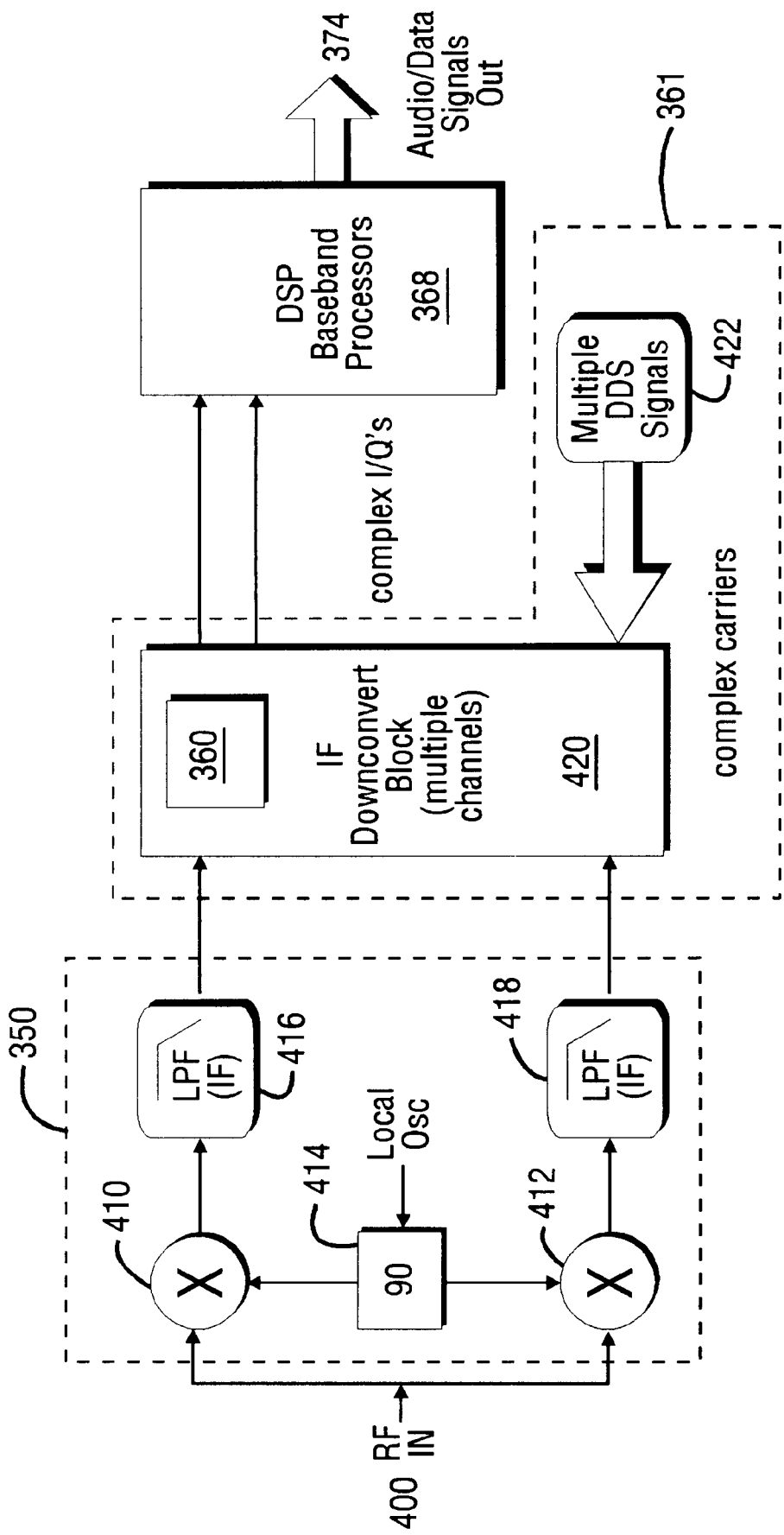
FIG. 4 is another example embodiment of the receive circuitry according to the present invention.
Figure 5:
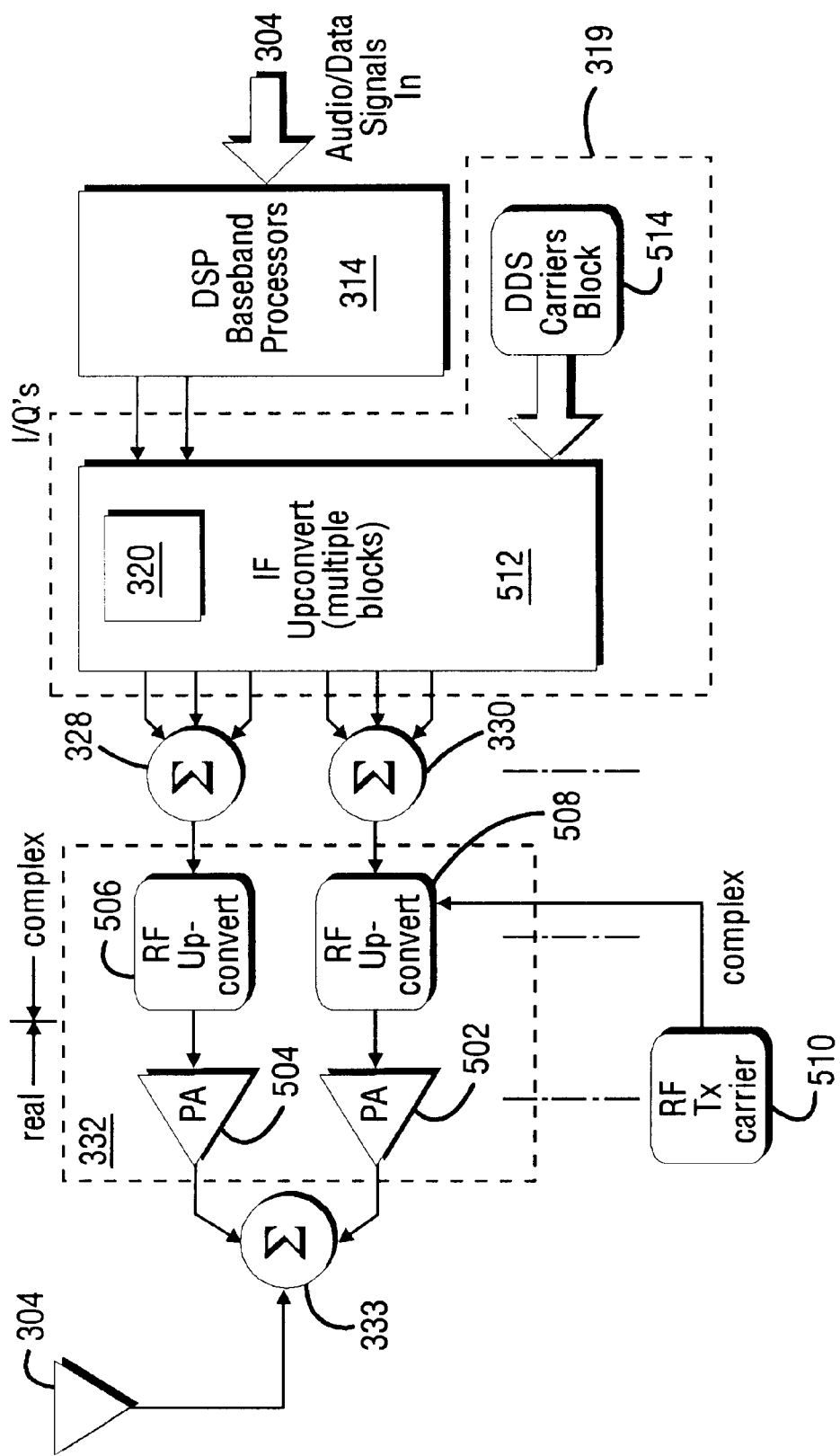
FIG. 5 is another example embodiment of the transmission system according to the present invention.

A more detailed description of an example embodiment of the present invention is provided in FIGS. 4 and 5. In FIG. 4, the receive blocks are shown in more detail, and in FIG. 5, the transmission blocks are shown in more detail.

In FIG. 4, the RF input 400 is provided to the demodulator 350 (seen also in FIG. 3). The demodulator 350 includes two mixers 410 and 412, a 90 degree phase shifter 414, and two low pass filters 416 and 418. The RF input 400 is a complete band of RF signals. The complete band is provided to the mixers 410 and 412, where they are down-converted to intermediate frequency by the local oscillator and converted into I and Q signals by the 90 degree phase shifter 414. Thus, the above demodulator 315 would use a single carrier to complex down-convert an entire, for example, 20+ MHz $R_x$ band of interest for the system. The carrier IF frequency is preferably placed at the center of the band of interest, although this particular carrier frequency is not an exclusive requirement. From the mixers 410 and 412, the complex signal of 20+ MHz band is low pass filtered to eliminate the signals outside the band of interest.

Ideally, the complete band is kept at a low signal level at the output of the filters 416 and 418 in order to prevent any signals from clipping the circuits and causing distortions or loss of smaller signals.

Once down-converted, a signal of interest is extracted by the Rx channel extractor 361. This is done using a complex multiplier that effectively complex down-converts to the base band. While traditionally this down-convert to base band step is done using a zero-IF block, the present invention instead employs a four multiplier (and three summer) logic gate that performs the down-conversion. This down-conversion occurs in IF down-convert block 420 using mixer array 360 and multiple DDS signals 442. The operation of the $R_x$ channel extractor 361 is described in more detail with respect to FIG. 6.

The output of the $R_x$ channel extractor 361 is a set of complex I/Q signals that are provided to respective DSP base band processors 368. From the DSPs, audio output signals 374 are provided.

Figure 6:
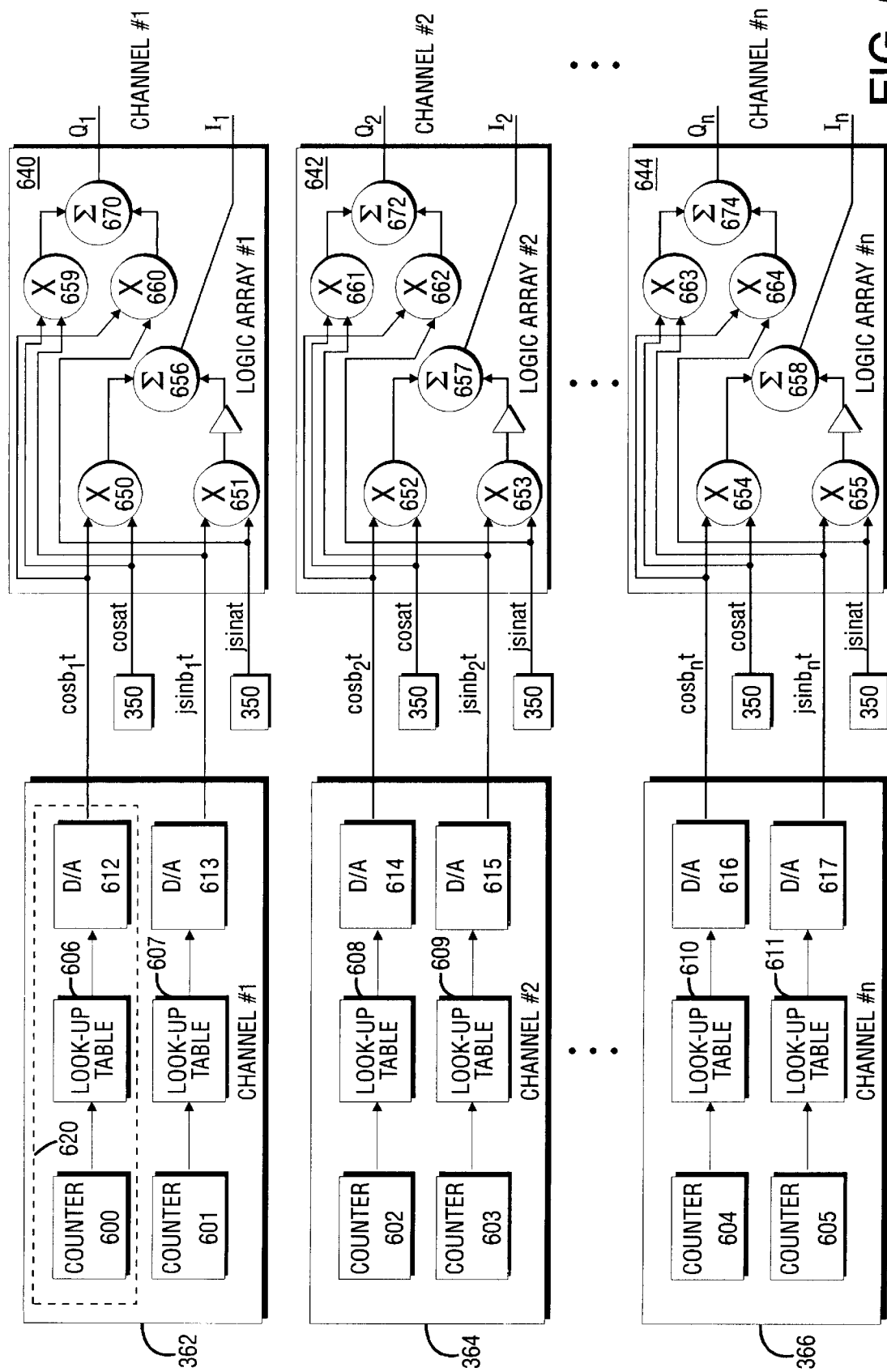
FIG. 6 is a schematic diagram of the channel extraction circuitry of FIG. 4.

The $R_x$ channel extractor 361 is shown in greater detail in FIG. 6. In FIG. 6, the DDS's 422 (FIG. 4) are shown on the left side of the Figure as DDS 362 for channel 1, DDS 364 for channel 2, and so on up to DDS 366 for channel n. Of course, additional DDS's are provided for each of the channels required up to "n" channels. The mixer array 360 (FIG. 3) is composed of a number of mixer sub-array 640–644. Mixer array 640 is provided for channel #1, mixer array 642 is provided for channel #2, and mixer array 644 is provided for channel #n. The output of the various logic mixer sub-array 640–644 are the quadrature signals for the respective channels ($I_1$/$Q_1$, $I_2$/$Q_2$ . . . $I_n$/$Q_n$).

The DDS 362, DDS 364, and DDS 366 are each composed of a pair of wave generators 620. Each wave generator 620 includes a counter 600, lookup table 606, and D to A converter 612. The counter 600 provides addresses to the lookup table 606, which outputs a series of digital data to the D to A converter 612. The output of the lookup table 606 will be a waveform, such as a cosine or sine wave in digital format. The D to A converter 612 then converts the waveform to the (usually) sinusoidal output at a particular frequency.

Thus, each of the wave generators 620 in the respective DDSs 362–366 include counters 600–605, lookup tables 606–611, and D to A converters 612–617. In the preferred embodiment, the output of the respective wave generators 620 in the DDSs 362–366 will have real and imaginary components, $e^{jbt}$=(cos $b_n$t+j sin $b_n$t). Thus, the DDS 362 for channel 1 will provide an output of cos $b_1$t as a real component and sin bit as an imaginary component. Similarly, the remaining DDSs 364–366 for n number of channels will provide outputs of cos $b_n$t and j sin $b_n$t.

Each of the mixer sub-array 640–644 receive corresponding pairs of these DDS outputs from the DDS's 362–366. The mixer sub-array 640 for channel 1 is described in greater detail below, but the description applies equally well for any of the n channels, at their respective frequencies dictated by the outputs of their respective $e^{jbt}$ outputs from their corresponding DDSs.

Mixer sub-array 640 includes 4 multiplication gates 650, 651, 659, and 660. It also includes two summing gates 656 and 670. The mixer sub-array 640 receives four inputs: cos $b_1$t and j sin $b_1$t (from $e^{jbt}$), together with the I and Q outputs from the demodulator 350 (FIG. 3). The outputs of the demodulator 350 are also complex and can be identified as $e^{jat}$ (i.e., cos at+j sin at). In mixer sub-array 640 for channel 1, the real components (cos $b_1$t and cos at) are multiplied in multiplier 650 while the imaginary components (j sin $b_1$t and j sin at) are multiplied at multiplier 651. Summer 656 then receives the outputs of multipliers 651 and 650 and subtracts one from the other to provide the $I_1$ output for channel 1. Meanwhile, multiplier 659 multiplies cos at and j sin $b_1$t while multiplier 660 multiplies cos $b_1$t and j sin at. The output of the multipliers 659 and 660 are then summed together to provide the $Q_1$ output for channel 1.

The basis for the mixer in mixer sub-array 640 can be shown mathematically as follows: since the output of the IF demodulator 350 is $e^{jat}$ and the output of the DDS 362 is $e^{jbt}$, then the multiplication of the two yields:

$$e^{jat} * e^{jbt} = e^{j(a+b)t} = (\cos at + j \sin at)(\cos bt + j \sin bt).$$

This equation corresponds with the outputs shown in FIG. 6, where the first multiplier (cos at+j sin at) corresponds to the IF audio for the band at issue and the second multiplier (cos bt+j sin bt) corresponds to the DDS signal for the channel at issue. The multiplication (cos at+j sin at) (cos bt+j sin bt) corresponds in form to (a+jc) (b+jd) which can be resolved as ab−cd+jad+jcb. This final equation is what is being provided by mixer sub-array 640–644.

The above equation is provided as an illustration. Another example (illustrating a mixing to baseband, i.e., zero IF from a carrier frequency level) can be performed using the following equation: $e^{j(at+\phi t)} * e^{jat}$, where "a" is the carrier frequency, "$\phi$" is the phase of modulation. The product is $e^{j(at+\phi t-at)} = e^{j\phi t} = \cos\phi t + j \sin\phi t$. $\phi t$ can then be extracted as the $$\arctan\left(\frac{\sin \phi t}{\cos t \phi t}\right),$$

which can be labeled, for example, as +10 MHz.

In mixer arrays 640–644, the complex multiplies are performed at a relatively low frequency since the band is small (for example, in an 800 MHz mobile radio, the band could be plus or minus 10 MHz). This relatively low frequency is optimum to ensure that accurate complex multipliers are easy to implement. Any significant balance issues that may exist (such as are described and remedied in co-pending, co-assigned patent application Ser. No. 08/784, 576 "Method and Apparatus For Compensating For Imbalances Between Quadrature Signals," filed Jan. 17, 1997, which is incorporated herein by reference) will primarily exist for the initial down-convert and can be carefully controlled or aligned in accordance with the application just identified.

Importantly, the various receiver blocks in the receiver circuitry of FIG. 4 can be easily integrated and multiple versions can be easily created.

As an alternative method, the down-convert could be a simple carrier mix down with a band pass limit implemented for the band. Beyond that, the blocks would be simple zero-IF down-convert blocks, as are known in the art. As opposed to this alternative method, however, the complex method is preferred because it keeps the IF frequencies at half the band. The complex method also minimizes image problems and minimizes constraints on the IF band pass filter.

Due to the inherent problems described in the Background section above, some in the art have discounted and ignored the basic concept of multi-channel block processing for some time now. It is within this environment of multiple failures within the industry to resolve these problems that the present invention recognizes that doing a fully hardware 2-level mix to baseband approach could accomplish the task and not have any of these inherent problems. The reasons that the present invention overcomes these problems are listed below:

The fact that the DSP does not get the signal until it is a single baseband channel allows the DSP to only process at a low sampling frequency.

The use of no gain stages (maybe a little with a high intercept point to improve noise figure) from the antenna to the channel baseband signal means that only the signal of interest is amplified. This is only practical by keeping the signals in the analog hardware realm through the 2 stages of signal down conversion. The circuits can still be overloaded but the dynamic range is as good as or better than any single channel receiver as it too can be overloaded by a strong signal. In fact, by using a higher intercept point rf buffer one could possible achieve a higher dynamic range with this system than a number of separate receivers with perhaps a lower intercept point buffer. A benefit is that the user needs only to buy one for all the channels.

The DDS blocks 362–366, which provide the $e^{jbt}$ signals to the mixer sub-array 640–644, provide a number of different frequency carriers as mix down carriers for the desired channels. For example, for an 800 MHz portable radio, the IF frequency band may be plus or minus 10 MHz, such that the carrier frequencies from the DDS blocks 362–366 will provide a number of frequency carriers of from minus 10 MHz to plus 10 MHz as the mix down carriers for the desired channels. Note that the minus 10 MHz signal is simply an inversion of the imaginary component of the DDS signal.

Although a number of different approaches can be used to provide the different frequency mix down carriers, the preferred approach is to generate each mix down carrier with independent DDS blocks, as shown in FIG. 6. The DDS blocks are easily integrated and provide very accurate quadrature signals. Further, the multiple DDS blocks can be integrated on the same piece of silicon. DDS blocks are commercially available to generate very accurate sine waves by outputting a digital sine wave to a D to A converter. Indeed, DDS blocks can also integrate the D to A's on the same piece of silicon as well.

The I and Q signals from the desired channel ($I_1/Q_1$, $I_2/Q_2$ ... $I_n/Q_n$) from FIG. 6 are output to the DSPs for the respective channels 368 (FIG. 3) which control the input gain and extract the phase signal. As shown in FIG. 3, the DSPs 368 may be dedicated to each respective channel, or a single DSP may perform tasks for multiple channels. In either event, the DSP(s) will pass the demodulated signal to the appropriate destination as needed, as shown as "audio out" 374 in FIG. 3.

With the embodiment of FIG. 6, generating the multiple signals from the DDS blocks 362–366 and mixer array blocks 640–644 may initially seem cumbersome, but the effect is to replace "n" different stations with only a single one, thus making this approach a significant advancement over prior systems in terms of space and construction savings. Further, the interface for the single station according to the present invention is made much simpler. It can be, for example, a single Ti carrier for the entire site. Further, the controller for the station can be a very fast, powerful processor that does not need to establish communication between stations as in older methods. In fact, the controller can most likely serve as the site controller as well.

FIG. 5 illustrates the schematic diagram for the transmission aspects of the present invention. In essence, the transmission process is simply a reverse of the reception process described with respect to FIG. 4. In FIG. 5, the audio signals are input at 304 into the DSPs 314. The output of the DSPs 314 are I/Q signals for the respective channels, which are input to the intermediate frequency up-convert blocks 512. In the up-convert blocks 512, mixer array 320 is used to employ a four multiplier up-convert process, in a reverse manner to that shown in FIG. 6. As in FIG. 6, the DDSs 514 (corresponding to DDSs 362–366) provide carrier frequencies for the intermediate frequency band. These DDS carriers provide the mix-up carrier signals needed to slot the I/Q signals from the DSPs 314 into their respective intermediate frequency channel locations.

The outputs of the intermediate frequency up-convert blocks 512 are separated into real and imaginary components. The real components are summed in summing gate 328 and the imaginary components are summed in summing gate 330. Each of the summing gates 328 and 330 are connected to standard two mixer RF up-convert I/O modulators 506 and 508. The RF up-convert I/O modulators 506 and 508 bring the intermediate frequency I and Q signals up to RF band using RF transmission carrier 510.

The output of the RF up-converters 506 and 508 are then input to respective power amplifiers 502 and 504. The RF up-converters 506 and 508, together with power amplifiers 502 and 504, make up the RF modulation and amplification block 332 (FIG. 3). The outputs from the power amplifiers 502 and 504 (i.e., the real and imaginary components) are summed in summing gate 333 and then output to antenna 304 for transmission as a frequency band.

The $T_x$ up-convert block 512 performs the reverse function as the $R_x$ down-convert block 420 described in detail with respect to FIGS. 4 and 6 above. The DDS carriers 514 up-convert the signals in the IF up-convert blocks 512 to their proper slot in the transmission frequency band (in the IF frequency). Thereafter, the real and imaginary components are respectively summed in summing gates 328 and 330 to yield a IF frequency band of signals. The RF up-converters 506 and 508, which receive the respective real and imaginary components up-convert the bands using the $T_x$ carrier 510, which may be centered in the IF band.

Although the system shown in FIG. 5 illustrates only a single power amplifier 502/504 for each RF up-converter 506/508, more than one power amplifier may be necessary per RF up-converter. That is, care must be taken to provide only that number of up-converted carriers to a single RF power amplifier in which the power amplifier can effectively handle. If the power amplifier is very linear in its characteristics and can sustain high powers, it can amplify many channels together. This may be the case, for example, with low power levels of cellular telephone signals. On the other hand, the higher powers used by, for example, some mobile radios may dictate fewer channels per power amplifier 502/504.

Figure 7:
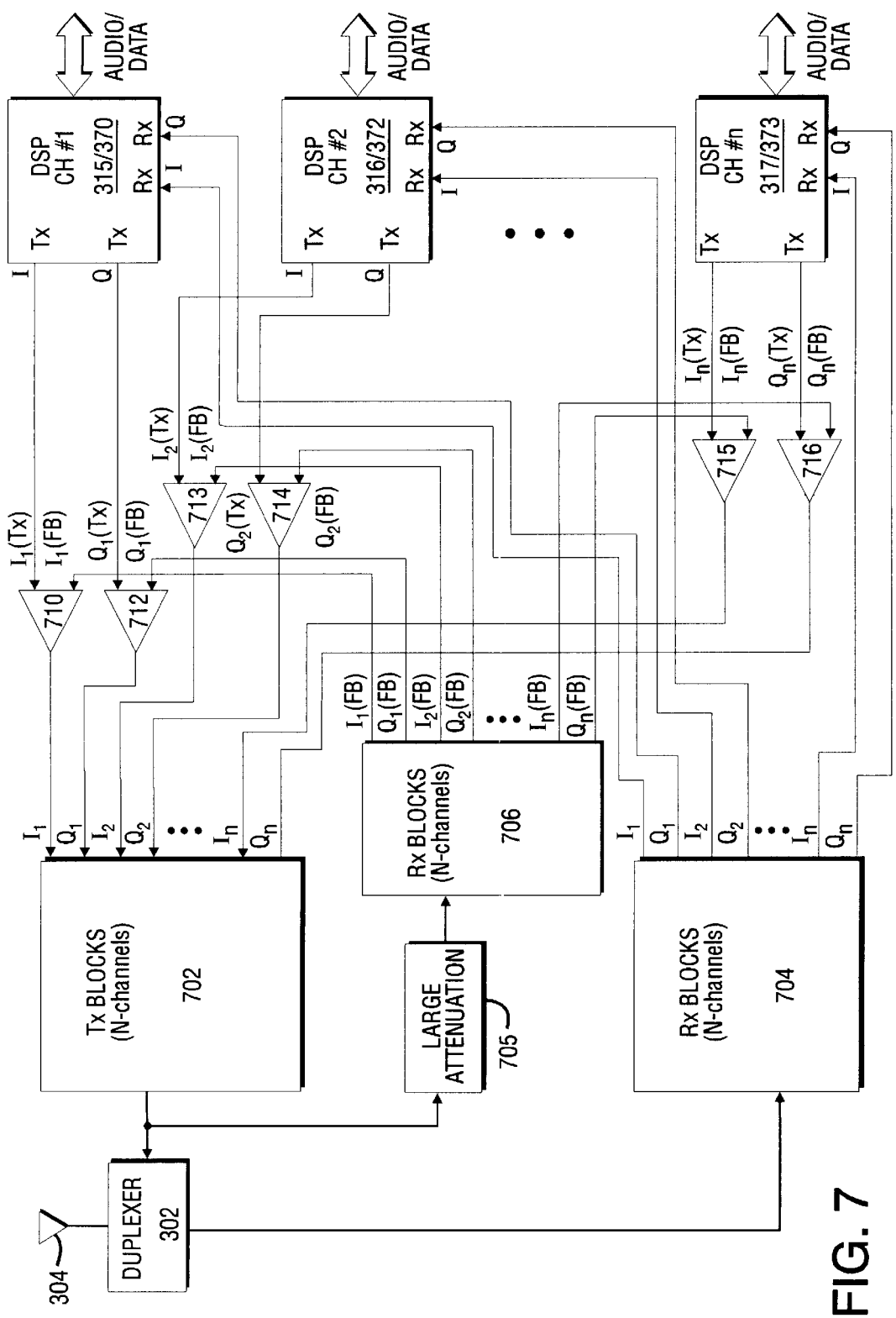
FIG. 7 is another example embodiment of the present invention.

The RF up-converters 506/508 are the two multiplier type. Traditionally, the RF up-convert is performed with Cartesian feedback techniques when processing a single station. In the present system, however, the Cartesian feedback technique can be created using a duplicate receive block to demodulate the transmission power amplifier output signals. An example of this type of feedback is shown in FIG. 7. There, the antenna 304 is shown connecting to a duplexer 302. The duplexer 302 selects either a receive mode in which the RF band from antenna 304 is provided to the $R_x$ blocks (for n number of channels) 704. Alternatively, in the transmit mode, duplexer 302 provides a path from the $T_x$ blocks (for n channels) 702 to the antenna 304.

The $T_x$ blocks 702 are shown as a block representation of all components from the output of the DSPs 314 (FIG. 3) to the output of the summing gate 333 (FIG. 3). In FIG. 7, the $T_x$ blocks 702 receive a plurality of quadrature signals ($I_1/Q_1$, $I_2/Q_2$, ... $I_n/Q_n$) from the DSPs 315, 316, 317, etc., as shown in FIG. 3. In FIG. 7, however, unlike FIG. 3, the $T_x$ blocks 702 receive feedback from a duplicate $R_x$ block (for "n" channels) 706. That is, the output from the power amplifiers and the summing gates 333 (FIG. 5) are provided not only to the duplexer 302, but also to a feedback loop consisting of a large attenuation 705 and a set of $R_x$ blocks (for "n" channels) 706. The $R_x$ blocks 706 are identical to the $R_x$ blocks 704. That is, the $R_x$ blocks 706 are repeated over $R_x$ blocks 704 for purposes of Cartesian feedback.

In an alternative embodiment, the same DDS blocks can be used for both the $T_x$ path and the $R_x$ path. Although the $T_x$ & $R_x$ frequencies may be offset by a specified band, there respective offsets from center (frequency) can be the same. For example, if the $T_x$ & $R_x$ paths are using frequencies 45 MHz offset from each other, the same DDS blocks can still be used for both if their respective operation ranges are each +12.5 MHz off of their respective center frequencies. This modification is relatively straightforward and can result in substantial cost savings due to the reduction in the number of required DDS blocks.

In still further embodiments, the DDS's are replaced with any type of waveform generator, such as synthesizers.

The present invention places no limit on the number of channels that can be employed.

Like the embodiments of FIGS. 4 and 6, the $R_x$ blocks 706 in FIG. 7 provide a plurality of quadrature output signals for the respective channels $I_1$ (FB)/$Q_1$ (FB), $I_2$ (FB)/$Q_2$ (FB), . . . $I_n$ (FB)/$Q_n$ (FB). These I/Q feedback signals are provided to op amps 710, 712, 713, 714, 715, 716, where they are combined with the transmission outputs from the respective DSPs 315, 316, 317. That is, the $I_1$ output from DSP 315 channel 1 ($I_1$ ($T_x$)) is combined with the $I_1$ output from the feedback loop originating in $R_x$ block 706 ($I_1$ (FB)) in the op amp 710. The output of the op amp 710 is then provided to the $T_x$ block 702 as the $I_1$ signal. In the $T_x$ block 702, the $I_1$ signal provided by op amp 710 is processed in the same manner as the "I" signal provided to up-convert block 512, as described above with respect to FIG. 5. Similarly, in FIG. 7, $Q_1$ ($T_x$) is combined with $Q_1$ (FB), and so on, for each of the quadrature signals from the DSPs and the feedback loop.

As shown in FIG. 7, the DSPs (315, 316, 317, etc.) for the transmitter portions of the system 300 can be the same DSPs (370, 372, 373, etc.) per channel used by the receiving portions. Still further, all of the DSPs (315/370, 316/372, 317/373, etc.) for the transmitters and the receivers can be combined into a single DSP to process all channels on both the transmit and receive sides.

The Cartesian feedback described with respect to FIG. 7 can be performed on the entire band or, alternatively, on any individual segments of channels or groups of channels desired.

As can be seen from the present disclosure, an entire site of receive and transmit channels for a given band can be serviced in a smaller and more efficient integrated unit. Further, the present invention can be supplemented to integrate multiple bands in addition to multiple channels for a given band. Since the present invention up-converts or down-converts based on an RF band of signals, rather than on a particular channel within the band, a significant number of components are eliminated versus the prior art, thus permitting dramatic cost savings and space savings. In addition, the efficiencies of the present invention over the prior art permit the present invention to be incorporated on single ICs, thus providing still further space and manufacturing efficiencies.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A RF receiver, comprising:
   an antenna to receive a band of frequencies containing a plurality of channels;
   a first down-converter to mix the entire band of frequencies down to a complex intermediate band of frequencies containing the plurality of channels;
   a waveform generator, including a plurality of independent direct digital synthesis blocks, one per channel, a multitude of which are formed on a common piece of silicon, to output complex quadrature periodic waveforms at baseband frequencies corresponding to the plurality of channels; and
   a second down-converter, including mixer array blocks coupled to the direct digital synthesis blocks, to extract a channel from the complex intermediate band of frequencies by mixing the corresponding complex intermediate band of frequencies with the corresponding complex quadrature periodic waveforms.

2. A RF receiver as in claim 1, wherein the first down-converter includes a two multiplier mixer.

3. A RF receiver as in claim 2, wherein the two multiplier mixer employs a carrier frequency approximately centered on the intermediate frequency band.

4. A RF receiver as in claim 1, wherein the waveform generator is a plurality of sinusoidal waveform generators, with one sinusoidal generator per channel providing a real component of said complex quadrature periodic waveforms and another sinusoidal generator per channel provide an imaginary component of said complex quadrature periodic waveform.

5. A RF receiver as in claim 1, wherein the second down-converter includes a four multiplier mixer.

6. A RF receiver as in claim 1, wherein the second down-converter includes a separate four multiplier mixer for each channel to receive corresponding separate pairs of the complex quadrature periodic waveforms.

7. A RF receiver as in claim 1, wherein the second down-converter includes a separate pair of four multiplier mixers for each channel to receive corresponding ones of the complex quadrature periodic waveforms.

8. A RF transmitter, comprising:
   at least one digital signal processor to receive audio signals from a plurality of channels and to process the audio signals into separate complex quadrature audio signals for each channel;
   a waveform generator, including a plurality of independent direct digital synthesis blocks, one per channel, a multitude of which are formed on a common piece of silicon, to output complex quadrature periodic waveforms at intermediate frequencies corresponding to the plurality of channels;
   a first up-converter, including mixer array blocks coupled to the direct digital synthesis blocks, to mix the separate complex quadrature audio signals with the complex quadrature periodic waveforms into a band of intermediate frequencies containing the plurality of channels;
   a second up-converter to mix the entire band of intermediate frequencies into a band of radio frequencies containing the plurality of channels; and
   an antenna to transmit the band of radio frequencies containing the plurality of channels.

9. A RF transmitter as in claim 8, wherein the waveform generator is a plurality of sinusoidal waveform generators, with one sinusoidal generator per channel providing a real component of said complex quadrature periodic waveforms and another sinusoidal generator per channel provide an imaginary component of said complex quadrature periodic waveform.

10. A RF transmitter as in claim 8, wherein the first up-converter includes a four multiplier mixer.

11. A RF transmitter as in claim 8, wherein the first up-converter includes a separate four multiplier mixer for each channel to receive corresponding separate pairs of the complex quadrature periodic waveforms.

12. A RF transmitter as in claim 8, wherein the first up-converter includes a separate pair of four multiplier mixers for each channel to receive corresponding ones of the complex quadrature periodic waveforms.

13. A RF transmitter as in claim 8, wherein the second up-converter includes a two multiplier mixer.

14. A RF transmitter as in claim 8, further including, a feedback loop having:
   a loop input connected between the second up-converter and the antenna, and
   a loop output connected between the at least one digital signal processor and the first up-converter.

15. A RF transmitter as in claim 14, wherein the feedback loop includes:
  an attenuator;
  a first down-converter to mix the band of radio frequencies containing the plurality of channels down to a complex intermediate band of frequencies containing the plurality of channels;
  a waveform generator to output complex quadrature periodic waveforms at baseband frequencies corresponding to the plurality of channels;
  a second down-converter to extract the channels from the complex intermediate band of frequencies by mixing the complex intermediate band of frequencies with the complex quadrature periodic waveforms; and
  an error corrector connected to receive the separate complex quadrature audio signals from the digital signal processor, to error correct the separate complex quadrature audio signals based on the channels extracted by the second down-converter, and to output the error-corrected complex quadrature audio signals to the first up-converter.

16. A RF transmitter as in claim 15, wherein the first down-converter includes a two multiplier mixer.

17. A RF transmitter as in claim 16, wherein the two multiplier mixer employs a carrier frequency approximately centered on the intermediate frequency band.

18. A RF transmitter as in claim 15, wherein the waveform generator is a plurality of sinusoidal waveform generators, with one sinusoidal generator per channel providing a real component of said complex quadrature periodic waveforms and another sinusoidal generator per channel provide an imaginary component of said complex quadrature periodic waveform.

19. A RF transmitter as in claim 15, wherein the second down-converter includes a four multiplier mixer.

20. A RF transmitter as in claim 15, wherein the second down-converter includes a separate four multiplier mixer for each channel to receive corresponding separate pairs of the complex quadrature periodic waveforms.

21. A RF transmitter as in claim 16, wherein the second down-converter includes a separate pair of four multiplier mixers for each channel to receive corresponding ones of the complex quadrature periodic waveforms.

22. A RF device for processing audio signals in a band of frequencies having multiple signal channels, the RF device containing:
  a down converter to down-convert the audio signals in the entire band of frequencies into an intermediate frequency band of quadrature audio signals; and
  circuitry, including a plurality of independent direct digital synthesis blocks, one per channel, a multitude of which are formed on a common piece of silicon, and including mixer array blocks coupled to the direct digital synthesis blocks, to extract a desired signal existing on one of the multiple channels from the down-converted audio signals by applying quadrature carriers at an appropriate frequency to the down-converted audio signals according to the equation: ab−cd+jad+jcb, where "a" and "c" are, respectively, said quadrature audio signals, and "b" and "d" are, respectively, said quadrature carriers.

23. A RF device as in claim 22, wherein the down-converter includes mixers employing a carrier frequency approximately centered in the band of frequencies.

24. A RF device as in claim 22, wherein the down-converter includes a two multiplier de-modulator.

25. A RF device as in claim 24, wherein the down-convert includes:
  input mixers to simultaneously receive the band of frequencies;
  a 90 degree phase shifter connected to the mixers; and
  an oscillator connected to the mixers to receive corresponding ones of the outputs of the mixers.

26. A RF device as in claim 22, wherein the direct digital synthesis blocks provide the quadrature carriers and the mixer array blocks down-convert according to said equation.

27. A RF device as in claim 22, wherein the direct digital synthesis blocks are independent sinusoidal waveform generators to generate said quadrature carriers.

28. A RF device as in claim 22, wherein the mixer array blocks are provided one per channel; and
  wherein the RF device further includes at least one digital signal processor to receive the outputs of the mixer array blocks.

29. A RF device as in claim 28, wherein the RF device includes separate digital signal processors, one for each channel, to receive the outputs of corresponding ones of the mixer array blocks.

30. A RF device as in claim 28, wherein each direct digital synthesis block produces two sinusoidal signals corresponding to signals "b" and "d".

31. A RF device as in claim 22, wherein the down-converter includes:
  two mixers, each to receive the band of frequencies;
  a 90 degree phase shifter;
  an oscillator, connected with the 90 degree phase shifter to produce, respectively, 0 degree and 90 degree phase shifted carrier frequencies for the mixers; and
  two filters, connected to receive corresponding outputs of the mixers as cos $a_i t$ and j sin $a_i t$, where $a_i$ is an IF frequency in the intermediate frequency band; and
  wherein
    the direct digital synthesis blocks for each channel produce the quadrature carriers as cos $b_n t$ and j sin $b_n t$ where n is a corresponding channel and $b_n$ is a baseband frequency for the corresponding channel; and
    the mixer array blocks for each channel are connected to receive the cos $a_i t$ and j sin $a_i t$ signals from the down-convert circuitry and to receive the cos $b_n t$ and j sin $b_n t$ signals from corresponding ones of the direct digital synthesis blocks, and to perform thereon said equation.

32. A RF device as in claim 31, further include a plurality of digital signal processors connected to receive outputs of corresponding ones of the mixer arrays for conversion to corresponding audio signals.

33. A RF wireless communication base station, comprising:
  an input to receive a plurality of audio input signals; and
  a plurality of transmitter blocks corresponding to a plurality of channels, each transmitter block comprising:
    a digital signal processor to accept one of said audio input signals and convert said one audio input signal into a quadrature pair of digital audio signals (signals "a" and "c");
    a pair of wave generators to respectively generate two quadrature waves (signals "b" and "d") at an appropriate intermediate frequency corresponding to one of said plurality of channels; and
    a mixer array for calculating a quadrature channel signal in which:

I=$ab-cd$, and

Q=$jad+jcb$;

the transmitter section further including a pair of summing gates to respectively sum two or more of said "I" signals from said transmitter blocks and two or more of said "Q" signals from said transmitter blocks;

an RF modulator to modulate the output of each of said summing gates to a RF frequency;

an output summing gate to sum the values of the outputs of the RF modulator; and an antenna to transmit the summed values of the outputs of the RF modulator over a bandwidth comprising the plurality of channels.

34. A RF wireless communication base station, as in claim 33, wherein the RF modulator is a two multiply modulator.

35. A RF wireless communication base station, as in claim 33, wherein the pair of summing gates sums, respectively, all of said "I" signals from said transmitter blocks and all of said "Q" signals from said transmitter blocks.

36. A RF wireless communication base station, as in claim 33, further including an amplifier to amplify the output from the RF modulator.

37. A RF wireless communication base station, as in claim 33, wherein the RF modulator provides a complex pair of outputs.

38. A RF wireless communication base station, as in claim 37, further including power amplifiers connected to receive corresponding ones of the complex pair of outputs.

39. A RF wireless communication base station, as in claim 33, wherein the transmitter section includes two sets of summing gates, one said set to sum respective sets of said "I" signals and the other set to sum respective sets of said "Q" signals;

the RF modulator including a pair of two-multiplier modulators, one to modulate respective outputs of said one set of summing gates and the other modulator to modulate respective outputs of the other said set of summing gates; and the station further comprising two pairs of power amplifiers to receive corresponding outputs of said pair of two-multiplier modulators.

40. A method of receiving a band of frequencies having a plurality of channels, comprising the steps of:

a) inputting the entire band of frequencies into a down converter;

b) de-modulating the band of frequencies to a complex intermediate frequency band including all of said channels;

c) down-converting the complex intermediate frequency band to a set of complex baseband frequencies corresponding to said respective channels by:

1) providing a plurality of independent direct digital synthesis blocks, one per channel, to generate a set of complex waveforms having baseband frequencies corresponding to said channels; and 2) providing a plurality of mixer array blocks, one per channel, coupled to corresponding ones of the plurality of digital synthesis blocks for down-converting said complex intermediate frequency band into respective baseband channel frequencies by combining said set of complex waveforms with said complex intermediate frequency band using four multiply modulation and d) inputting the baseband channel frequencies into a plurality of digital signal processors, one per channel, to generate a plurality of desired signals from corresponding ones of the plurality of channels.

41. A method of receiving as in claim 40, wherein the step of generating said set of complex waveforms includes the steps of:

1) generating a counting signal, 2) inputting the counting signal to a look up table to obtain a digital sinusoidal wave; and 3) converting the digital sinusoidal wave to an analog sinusoidal wave.

42. A method of receiving as in claim 40, wherein the step of down-converting includes the steps of:

1) inputting the complex waveforms in the form of cos $b_n t$+j sin $b_n t$, where $b_n$ is a baseband frequency in the set of complex baseband frequencies corresponding to a given channel, and 2) inputting the complex intermediate frequency band in the form of cos $a_i t$+j sin $a_i t$, where $a_i$ is an intermediate frequency in the intermediate frequency band.

43. A method of receiving as in claim 42, wherein the step of down-converting further includes the steps of:

1) solving ab−cd+jad+jcb, where a=cos $a_i t$ b=cos $b_n t$ c=sin $a_i t$, and d=sin $b_n t$.

44. A method comprising:

selecting one of a transmit mode or a receive mode;

in the transmit mode, transmitting a plurality of channels as a band of frequencies, in the receive mode, receiving a band of frequencies containing a plurality of channels;

wherein the transmit mode steps for transmitting include:

accepting audio input signals at said plurality of channels and converting said audio signals into complex audio signals for said channels;

accepting complex periodic waveforms at frequencies corresponding to said plurality of channels;

combining, on a channel-by-channel basis, the complex audio signals for said channels and the complex periodic waveforms; and modulating the combined signals into said band of frequencies;

wherein the receive mode steps for receiving include:

accepting the band of frequencies containing the plurality of channels;

demodulating at once the band of frequencies into a complex intermediate frequency band including all of said channels;

accepting complex periodic waveforms at frequencies corresponding to said plurality of channels;

combining, on a channel-by-channel basis, the complex intermediate frequency band with the complex periodic waveforms;

feeding back in the transmit mode, including the steps of:

accepting the modulated combined signals from the transmit block;

demodulating the modulated combined signals into a feedback complex intermediate frequency band including all of said channels;

accepting complex periodic waveforms at frequencies corresponding to said plurality of channels; and combining, on a channel-by-channel basis, the feedback complex intermediate frequency band with the complex periodic waveforms into feedback signals for the channels.

45. A method according to claim 44, further including the step of feeding pairs of op amps corresponding to said plurality of channels with said complex audio signals from said transmit mode and with said feedback signals from said feedback steps.

46. A method according to claim 45, wherein said op amps combine the complex audio signals and the feedback signals into the audio input signals.

* * * * *